United States Patent [19]
Schlangenotto

[11] Patent Number: 5,856,683
[45] Date of Patent: Jan. 5, 1999

[54] MOS-CONTROLLED THYRISTOR USING A SOURCE CATHODE ELECRODE AS THE GATE ELECTRODE OF A MOSFET ELEMENT

[75] Inventor: Heinrich Schlangenotto, Neu-Isenburg, Germany

[73] Assignee: Daimler-Benz Aktiengesellschaft, Stuttgart, Germany

[21] Appl. No.: 682,740
[22] PCT Filed: Jan. 28, 1995
[86] PCT No.: PCT/EP95/00301
 § 371 Date: Aug. 5, 1996
 § 102(e) Date: Aug. 5, 1996
[87] PCT Pub. No.: WO95/21460
 PCT Pub. Date: Aug. 10, 1995

[30] Foreign Application Priority Data

Feb. 1, 1994 [DE] Germany ............ 44 02 877.6

[51] Int. Cl.[6] ...................................... H01L 29/74
[52] U.S. Cl. .................. 257/139; 257/107; 257/110; 257/138; 257/140; 257/144; 257/146; 257/147; 257/152
[58] Field of Search ...................... 257/107, 110, 257/120, 121, 124, 132, 137, 138, 139, 140, 144, 146, 147, 152

[56] References Cited

U.S. PATENT DOCUMENTS

| | | | |
|---|---|---|---|
| 4,811,072 | 3/1989 | Risberg | 257/147 |
| 5,345,095 | 9/1994 | Niwayama | 257/137 |
| 5,625,203 | 4/1997 | Lilja | 257/132 |

FOREIGN PATENT DOCUMENTS

| | | |
|---|---|---|
| 0433825 | 6/1991 | European Pat. Off. . |
| 3408516 | 9/1985 | Germany . |
| 4126491 | 2/1993 | Germany . |
| 4310606 | 10/1993 | Germany . |

OTHER PUBLICATIONS

Shekar et al.: "Characteristics of the Emitter–Switched Thyristor". In : IEEE Transactions on Electron Devices, vol. 38, No. 7, Jul. 1991, pp. 1619–1623.

Primary Examiner—Tom Thomas
Assistant Examiner—Fetsum Abraham
Attorney, Agent, or Firm—Venable; George H. Spencer; Norman N. Kunitz

[57] ABSTRACT

A MOS-gate switched power semiconductor component with a semiconductor body that has a number of unit cells arranged side-by-side and switched in parallel and consisting of a p-emitter zone adjacent to the anode, an adjoining, weakly doped n-base zone, then a p-base zone and an adjoining n-emitter zone. Incorporated in the n-emitter zone of the unit cells are pairs of p[+] zones (5a, 5b) which, together with the n zone between them and an insulated gate situated above, form a lateral p-channel MOSFET (M1). The n-emitter zone (4) is equipped with a floating cathode contact (K') which at the same time constitutes the electrode of the p[+] region serving as source. The p+ region serving as drain is connected to an external cathode (K), which has no contact with the n-emitter zone. Another MOSFET is formed by the surface region of the p-base zone (3) and the intervening region of the n-emitter zone (4b) together with an insulating gate. The gate electrode of the second MOSFET is formed as part of the cathode metalization. There is a defined ratio of the breakdown voltages of the MOSFETs.

6 Claims, 3 Drawing Sheets

MOS-CONTROLLED THYRISTOR USING A SOURCE CATHODE ELECRODE AS THE GATE ELECTRODE OF A MOSFET ELEMENT

BACKGROUND OF THE INVENTION

The invention relates to a MOS-gate switchable power semiconductor component with a semiconductor body, having a plurality of unit cells, arranged side-by-side and switched parallel, which form a thyristor, and which comprise a p-emitter zone adjacent to the anode, an adjoining weakly doped n-base zone, followed by a connecting p-base zone that is joined by a n-emitter zone, into which pairs of p+-zones are embedded and which, together with the n-zone between them and an insulating gate arranged above, form a lateral first p-channel MOSFET, wherein on the one hand the drain area on the edge of the emitter zone is connected to the external cathode, which has no contact with the n-emitter zone, and on the other hand, the inside source area has a floating contact which makes simultaneous contact with the n-emitter zone, and wherein a second p-channel MOSFET is formed from the p+-zone that makes contact with the external diode, the surface area of the p-base zone and the intervening n-emitter zone, together with an insulating gate.

Such a power semiconductor component is known from DE 41 26 491. With this power semiconductor component, a p-channel MOSFET is integrated into the n-emitter zone of the thyristor, which channel is formed by two embedded p+-zones as source and drain area, as well as the MOS gate arranged above the n-conducting intervening region. The drain p+-zone at the edge of the n-emitter zone is connected to the cathode as contact electrode. The source p+-zone and the adjacent section of the emitter zone are equipped with a floating metal contact, which has an ohmic connection to the thyristor and the MOSFET, so that they are connected in series. A second p-channel MOSFET M2 is formed by the p-base of the thyristor, which extends to the surface, the p+-zone at the edge of the n-emitter zone, which makes contact with the cathode, as well as the n-emitter zone segment located in between, with the above-arranged insulating gate G2.

In order to shut down the component, the MOSFET M1, which is connected in series with the thyristor, is turned off while the MOSFET M2 is switched on simultaenously, thereby creating a secondary path from the p-base of the thyristor to the cathode. For this, the gates of the two MOSFET channels must be triggered with different gate signals. In order to achieve good shutdown behavior and a large, secure operating area (SOA) during the shutdown, both gate signals must be synchronized precisely as to time and absolute values. Interferences in the correlation of gate signals will reduce the operating area, and the component can easily be destroyed. Because a considerably more involved driver electronics is necessary, the shut-down via two gates with various control signals that must be synchronized, represents a great practical disadvantage as compared to other components, such as the IGBT. Another disadvantage is that the component does not have a characteristic with current saturation, meaning that the current does not tend toward a saturation value with increasing voltage. Thus, in case of a load short-circuit, the current is not limited by the component itself, so that fuses must be connected in series to prevent a destruction in case of a short circuit. This also applies if one of the gate connections and the cathode connection are linked on the outside. As a result of the inside resistance of the gate cathode circuit, caused among other things by the semi-insulated polycrystalline gate, the gate will not remain on the cathode potential in case of a rapid current and voltage rise. In other words, the component is not short-circuit proof.

In order to ignite the thyristor, a third and externally triggered MOSFET is integrated for the switching on of the component known from DE 41 26 491 A1. This MOSFET, which is designed as n-channel MOSFET of the enhancement type (normally-off) combines the n-emitter zone with the n-base of the thyristor when it is switched on. To switch on the component, the first and the third MOSFET are switched on and the second MOSFET is shut off. The additional gate needed for the switching on further increases the required expenditure for the driver electronics.

Field-effect controlled power semiconductor components, in the following also called components, are already used on a large scale in practical operations in the form of power MOSFETs and the insulated gate bipolar transistors (IGBT). The on-state voltage of MOSFETs increases strongly with the rising off-state voltage, for which they are dimensioned, because of the missing conductivity modulation, so that MOSFETs can only be used up to about 500 V. The IGBT as bipolar component exhibits a better on-state behavior with off-state voltages above 300 V than a MOSFET. However, compared to the MOS controlled thyristors, such as the component according to DE 41 26 491 A1, the on-state behavior of the IGBT above approximately 600 V blocking capacity is worse because its on-state and off-state characteristic features are determined by a bipolar transistor and not a thyristor. The switchable current per chip surface is therefore smaller than with the component according to DE 41 26 491. One advantage of the IGBT is, however, that it can be turned on and off by a gate, identical to the power MOSFET, and has a characteristic with current saturation.

Known are also special MOS-controlled thyristors (MCTs), comprising a MOSFET integrated into the n-emitter zone, which opens a secondary path from the p-base to the cathode when switched on, thereby shutting down the component. The shutdown behavior of this component, however, is impaired by the current filamenting. The on-state characteristic for the MCT is similar to that of a standard thyristor, meaning it does not have current saturation. That is why the MCT is not "short-circuit proof" either, which is viewed as a considerable disadvantage as compared to the IGBT. Above all, however, MCTs did not succeed in practical operations because of the current filamenting.

Another MOS-controlled thyristor, which is called an "emitter-switched thyristor" or EST was described in articles by Baliga et al.; see IEEE Trans. Electron Devices 38 (1991), p. 1619. With the EST, a MOSFET is integrated into the p-base of the thyristor and is connected in series with the thyristor structure. The EST shuts down if the MOSFET is shut down. One disadvantage of this component is that it contains a parasitic thyristor that makes contact with the cathode. In order to prevent this thyristor from switching on, the p-base, together with the n-emitter, is contacted through the cathode metallization, meaning it is short-circuited with the cathode. As a result of this, however, the floating main thyristor is prevented from engaging as well until it reaches a considerable distance from the short-circuit location. The individual component therefore must have a relatively large lateral dimension, so that the MOS channel width that can be reached for each semiconductor surface and thus also the switchable current per surface are strongly reduced here as well. As a result of the MOSFET connected in series, the characteristic hints at a current limitation. This limitation is not very distinct because, under normal operating conditions, the MOSFET is already entering the breakdown before the transition between p-base and n-base, which permits a higher voltage, starts to block significantly.

It is the object of the invention to improve the design of an MOS-controlled power semiconductor component of the above-described type in such a way that it can be shut down by a single gate and that it has a characteristic with current saturation. Furthermore, the power semiconductor component is to be improved such that it can be switched on with this gate as well.

SUMMARY OF THE INVENTION

The solution according to the inventions is that the breakdown voltage of the first lateral p-channel MOSFET, located between the external cathode and the floating contact, exceeds the absolute value of the threshold voltage of the second MOSFET by more than two volt and that the gate electrode of the second MOSFET is formed by the cathode metallization as well or is covered by it. This power semiconductor component is shut down by a gate voltage, which is positive in relation to the cathode or zero or positive in relation to the floating contact. It only requires a simple trigger circuit, such as the one used for the MOSFETs and IGBTs. This is also an important advantage for the practical application. In addition, the power semiconductor component is suitable for an extensive blocking voltage range, can switch a high current per surface area with small on-state voltage, and has a characteristic with current saturation.

A power semiconductor component for which in a portion of the unit cells a n-channel MOSFET is formed by a surface area of the n-base zone, the n-emitter zone and the intervening surface area of the p-base zone, together with an insulating gate, is designed according to the invention is such a way that the n-channel MOSFET is of the depletion type, that the absolute value of the threshold voltage for the depletion-type MOSFET is lower by at least two volts than the breakdown voltage for the first p-channel MOSFET, and that the gate electrode of the depletion-type MOSFET is formed also by the cathode metallization or is covered by it. This power semiconductor component is switched on by a negative voltage at the gate for the first MOSFET, so that a single, external gate is used for the switching on or shutting down. A negative gate voltage is applied for the switching on, and for the shutting down, the gate is connected to the floating cathode potential or set positive in relation to the cathode. This results in a component with a trigger circuit as simple as that for other MOS components, e.g. the IGBT. As compared to these known components, the switchable current per chip surface is considerably higher with simultaneously smaller on-state voltage. The component is also suitable for high off-state voltages. In contrast, the first and third MOSFET must be switched on and the second MOSFET shut down at the same time in order to switch on the semiconductor component known from the DE 41 26 491 A1. The different MOSFETs require different gate signals for this, as is described in particular in column 7, lines 21–25 of the DE 41 26 491.

Further suitable embodiments of the invention are described.

The invention is explained in more detail with the aid of exemplary embodiments shown in a drawing, from which further details, characteristics and advantages follow.

DETAILED DESCRIPTION OF THE PREFERRED EMBODIMENTS

Figure 1:
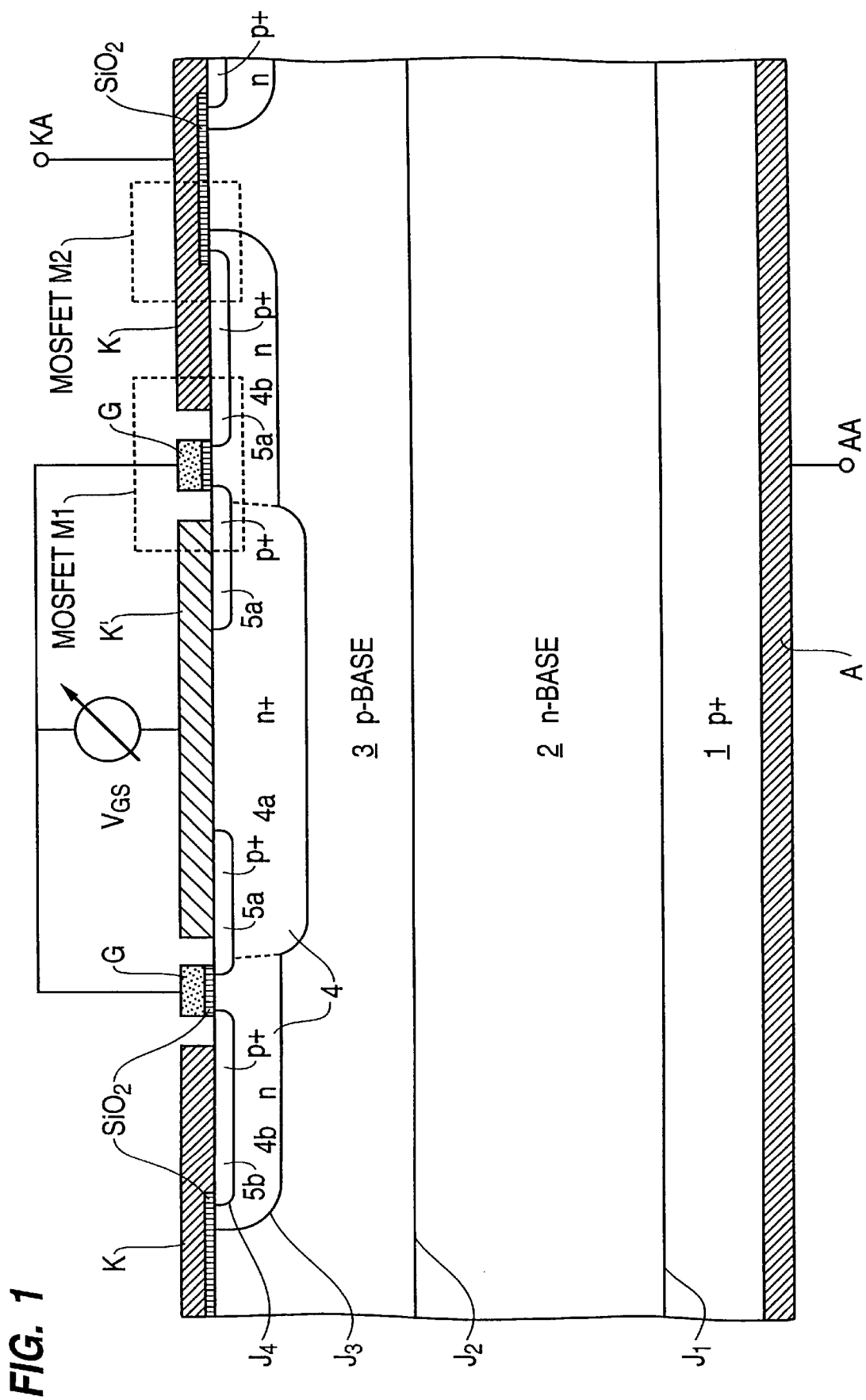
FIG. 1 is a cross-sectional view of a unit cell for a power semiconductor component in a form designed for shutting down (normal cell)

As can be seen from the cross-section in FIG. 1, a semiconductor body of a power semiconductor component has a pnp thyristor structure, consisting of a p-emitter zone 1 adjacent to anode A, an adjoining weakly doped n-base zone 2, a following p-base zone 3, which is also called p-base, and a therein embedded emitter-zone 4, which is preferably designed with striations in the direction running vertical to the focal plane. The n-emitter zone 4 is preferably subdivided into a highly doped central area 4a and weaker doped side areas 4b. Embedded into or each of the side areas 4b of zone 4 are a pair of spaced highly doped p+-zones, 5a, 5b, which run parallel to the edge surface of the n-emitter zone 4. Each pair of p+-zones 5a, 5b together with the intervening surface area of the n-zone 4 and an insulated gate G above, forms a p-channel MOSFET M1. In the central, highly doped area 4a, the n-emitter zone is provided with a floating cathode metallization K', which also makes ohmic contact with the inside arranged p+-strip 5a of each p+-zone pair. The p+-strips 5b, located at the edge of the n-emitter zone 4, make contact with a metal layer K, which serves as external an cathode for the component and has no contact with the n-emitter zone 4. The cathode K has a cathode connection KA. The MOSFET (M1) is connected in series with the thyristor structure, below the floating cathode K'. In forward or switching direction, the anode A is positively polarized in relation to the external cathode K.

FIG. 1 represents a second MOSFET area M2 between p-base 3 and the p+-zone 5b, which makes contact with the cathode. The gate for MOSFET M2, which is insulated by a dielectric, represented in FIG. 1 as $SiO_2$, is also formed by the cathode metallization K or is covered by it.

Initially, the shutdown from the on-state condition is described. The on-state current can only flow if the potential of gate G is negative in relation to the floating cathode K', which represents the source electrode of the MOSFET (M1), and forms a p-conducting inversion channel between zone 5a of the MOSFET (M1), which forms the source area, and the drain-area forming zone 5b. The hole current flowing from the floating cathode K' to cathode K is continued in the other direction in an equally large electron flow from K' into the thyristor structure. For the shutdown, the absolute gate voltage is lowered to a value below the threshold voltage VT, e.g. to 0, so that the p-channel between source area 5a and drain area 5b disappears. Thus, no electrons are flowing from K' into the thyristor. However, because there are still many surplus charge carriers in the structure and because the pn-transition $J_2$ between the n- and p-base zones, which is the only one that can absorb a high off-state voltage, does not yet block, the component would shut down without further measures only against a voltage that is lower than the MOSFET M1 breakdown voltage of, for example, 12 V. A shutdown against higher voltages would be possible only with a very slow voltage rise, where the charge carriers would have enough time to disappear through recombination. With the standard higher voltages and switching speeds, however, the MOSFET would be driven into the breakdown and the thyristor structure 1, 2, 3, 4a would continue to be supplied fully with current, wherein the voltage at the component is increased by the breakdown voltage of the MOSFET.

Figure 2:
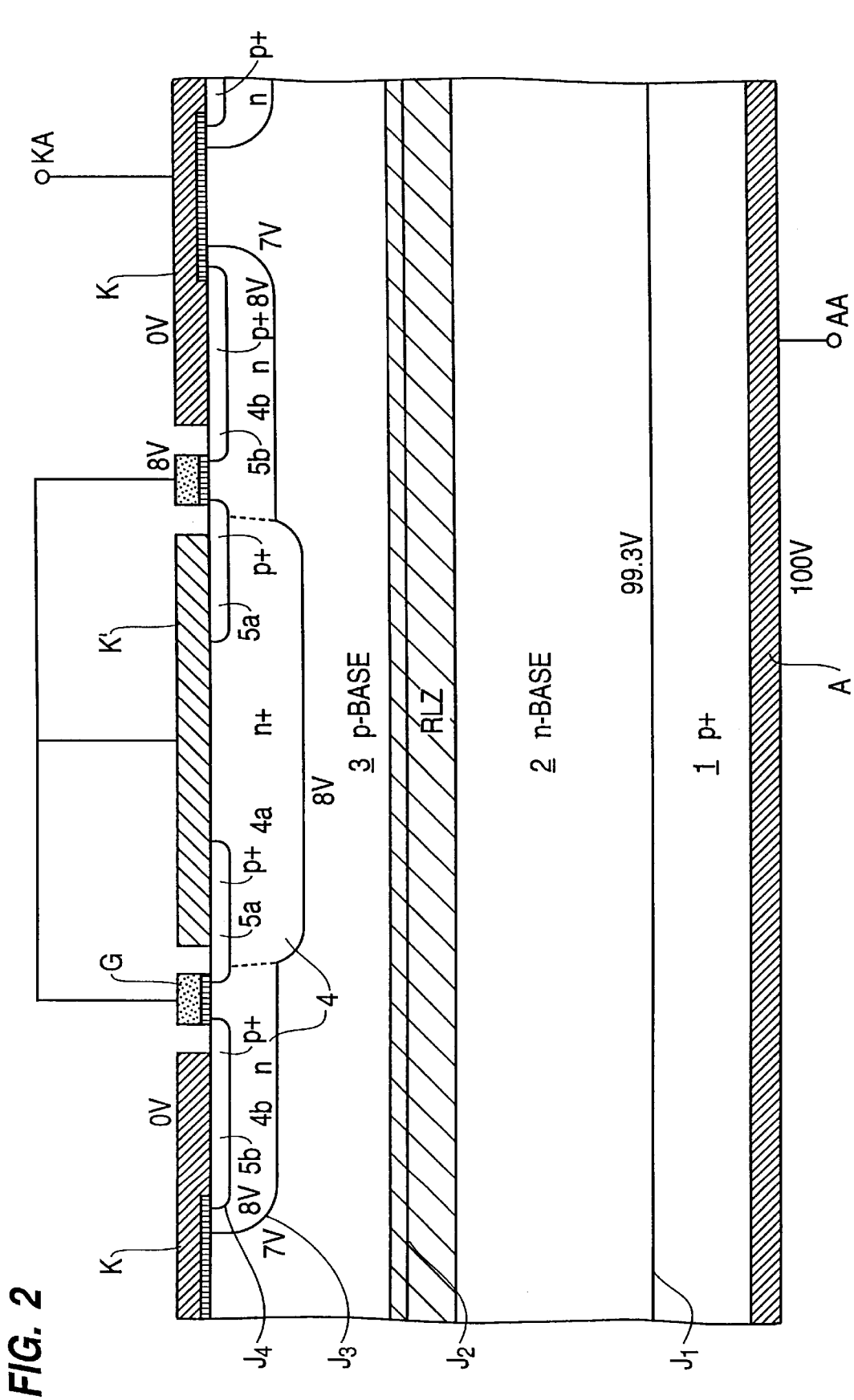
FIG. 2 shows the power semiconductor component according to FIG. 1, with potential values during the shutdown.

In order to permit a shut-down against higher voltages and with a rapid voltage rise, the component according to the invention is provided with the MOSFET M2, for which the gate is formed along with the cathode metallization. To illustrate the function of the MOSFET M2, the structure in FIG. 2 is provided with potential values for a shutdown point in time, at which the anode already has a voltage of 100 V in relation to the cathode. The given values apply to the external potential without the voltages impressed by the pn-transitions, wherein the potential for cathode K is set equal to zero. Because gate G is connected to the potential of source K' for the shutdown and because the source area 5a and the drain area 5b are no longer connected by a p-channel, a voltage forms between K' and K, which for the embodiment amounts to 8 V. The pn-transition $J_4$ between drain area 5b and n-emitter zone 4b is polarized in off-state direction by this voltage. If the threshold voltage of MOSFET M2 is lower, e.g. 4 V, then a p-channel forms above the n-zone, between the p+-zone 5b and the p-base, while the M2 gate is negatively polarized in relation to the semiconductor. Because there is no longer an electron flow flowing from the floating cathode K' to the thyristor structure underneath, the p-base 3 in the center area has the same potential as the n-emitter zone 4. This potential is somewhat lower in the secondary areas, e.g. 7 V, because holes flow there to reduce the charge carriers in the p-base 3 and the n-base zone 2 and to form the space charge region (RLZ), and holes flow through the channel to cathode K. As a precondition for the described function, the breakdown voltage $V_{Br}$ (M1) of the externally triggered MOSFET M1, which is determined by the pn-transition $J_4$, is adjusted higher than the threshold voltage $V_T$ (M2) of MOSFET M2.

By making the channel for MOSFET M1 disappear through short-circuiting of the gate with the source, the electron flow from the floating cathode K' into the thyristor is interrupted on the one hand, while on the other, a p-channel automatically forms in the MOSFET M2 and thus a current path for the holes to the cathode.

The breakdown voltage $V_{Br}$ (M1) of MOSFET M1 should exceed the threshold voltage $V_T$ (M2) of M2 by at least 2 V so that a p-channel forms in the MOSFET M2, which conducts well. It is expedient to have a difference of 10 V. The threshold voltage $V_T$ (M2) of M2 is selected to be low, preferably in the range of 1 V to 5 V, so that the MOSFET M2 switches on quickly when M1 is switched off. The threshold voltage $V_T$ (M2) should not be lower than 1 V because otherwise a secondary path between p-base and cathode exists in the on-state of the component already.

In order to obtain a low threshold voltage, it is favorable to use boron-doped polysilicon as the gate material, which, for the MOSFET M2, advantageously forms the gate directly on the oxide. In the exemplary embodiment according to FIG. 1, this gate is still covered by the cathode metallization.

The characteristic of the component in the on-state, that is with a negative gate voltage in relation to the floating cathode K', changes with increasing voltage to a range of nearly constant current, which can extend to very high voltages in contrast to the one for the MOSFET M1. Similar to what is shown in FIG. 2 for the shutdown, a p-channel forms in that case in the internal MOSFET M2 as soon as the voltage at the MOSFET M1 exceeds the threshold voltage of the MOSFET M2. From that point on, the effective current amplification factor $\alpha_{npn,eff}$ of the npn partial transistor (4a, 3, 2) drops sharply as a result of the secondary path with a further rise in the current, so that the thyristor is no longer saturated and the center pn-transition $J_2$ takes up voltage. The characteristic is then determined by the pnp transistor (consisting of p-emitter zone 1, n-base zone 2 and p-base 3), which is actuated with a constant base current from the MOSFET M1 and for which the collector current in the active range does not rise steeply with the voltage. The portion of this collector current, which is not needed for the control of the npn partial transistor (consisting of the n-emitter zone 4, the p-base 3 and the n-base zone 2) flows through the p-channel of the internal MOSFET M2 to the cathode and, together with the current for MOSFET M1, forms the current for the total component, which for that reason no longer drops sharply with the voltage. In case of a short-circuit, the operational point runs into this characteristic range of nearly constant current, from which the component is then shut down by lowering the gate voltage below the threshold voltage.

The component according to FIGS. 1 and 2 can be considered to be an integration of a so-called cascode circuit, which permits a quick shutdown of, for example, a high-capacity GTO with low control power by shutting down a series-connected low-voltage MOSFET, which causes the subsequently forming voltage to shut down the GTO as gate voltage. The discrete cascode circuit, however, is not often used because it is generally very costly because of the components needed in addition to the GTO and requires a lot of space. The monolithic integration according to the invention is considerably more favorable in this respect. Other advantages are a low interference liability and the lack of leakage inductances.

Figure 3:
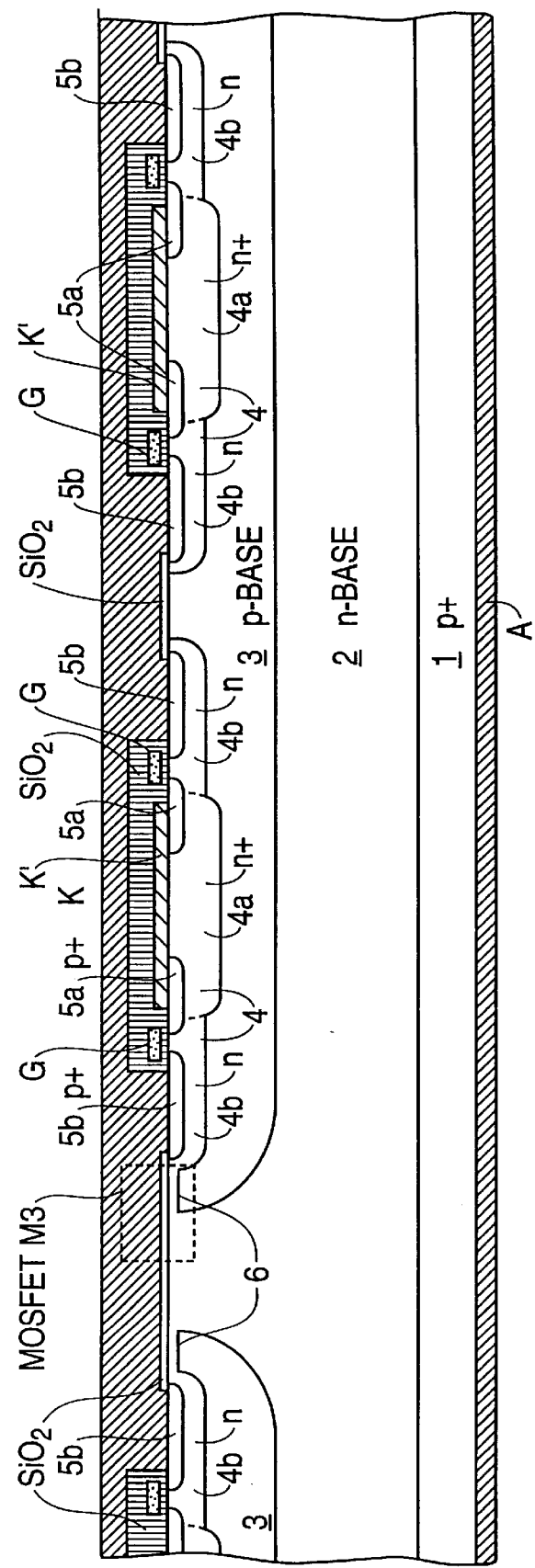
FIG. 3 shows a power semiconductor component with a normal unit cell and a unit cell that is designed for shutdown as well as ignition.

In order to switch the power semiconductor component from the (forward) off-state condition to the on-state condition, it is generally not enough to switch on the series-connected MOSFET M1 because the thyristor continues to block. It would be possible to switch on the component with the design shown in FIGS. 1 and 2 in this way only with a thyristor structure that basically does not block in forward direction. However, such a thyristor structure is hard to achieve with fast components and, in particular, is not present if the emitter-base transition $J_1$ on the anode side is short-circuited to improve the dynamic qualities. The structure must therefore be provided with a mechanism for igniting the thyristor. FIG. 3 shows an arrangement with a unit cell where the ignition takes place without an additional gate, through the structure of the semiconductor, as soon as the MOSFET M1 is switched on. The unit cell with ignition device (ignition unit cell) is shown on the left side of the Figure, together with a portion of a neighboring ignition cell, while a normal cell adjoins on the right, which can only be used for shutting down. The cathode metallization extends over the gate and the floating cathode as well, which are insulated by an undercoating, generally consisting of silicon dioxide.

The ignition unit cell is characterized in that at its edge, the n-base 2 is extended to the surface and the p-base 3 ends at the surface, as shown in FIG. 3. However, a n-channel 6 is doped into the surface area of the p-base, which connects the n-emitter zone 4 with the n-base 2 and, together with an insulating gate, forms a n-channel MOSFET M3 of the depletion type. The gate sits on the cathode potential and is represented in the embodiment shown by the cathode metallization as well, which also covers the gate oxide. If a negative voltage at the external gate G forms a p-channel between areas 5a and 5b, which connects cathode K via the floating cathode K' with the thyristor structure, then an electron flow flows over the n-channel 6 of the internal MOSFET M3 into the n-base zone and ignites the thyristor of the ignition unit cell. The ignited condition spreads subsequently through lateral flows in the p-base and n-base in the known way to the following unit cells, so that only a small percentage of the cells must have an ignition structure.

The blocking capacity and the shutdown capacity are not impaired by the ignition unit cell. If the p-channel of the external MOSFET M1 is made to disappear because gate G is short-circuited with K', then the potential at the p-base rises to positive values in relation to cathode K, as described in the shutdown explanation with the aid of FIG. 2. As soon as the potential difference to K exceeds the threshold voltage $V_T$(M3) of the MOSFET M3, the n-channel of the MOSFET M3 disappears because its gate K is polarized negatively in relation to the semiconductor. This interrupts the connection between n-base 2 and n-emitter zone 4, and the pn-transition $J_2$ between n- and p-base becomes fully blocking. In order to exceed the threshold voltage $V_T$ (M3)—that is the absolute value—this threshold voltage must be lower than the breakdown voltage $V_{Br}$(M1) of the MOSFET M1, just as for the MOSFET M2.

The condition of a low threshold voltage and a clearly higher on-state voltage of the MOSFETs can be realized technologically in different ways through the doping of range 4b of the n-emitter zone 4 and through the doping gradients at the pn-transition $J_4$. In order to suppress the effect of the parasitic transistor formed by zones 5b, 4b and 3 and to avoid a punch-through, the doping of zone 4b, on the other hand, should not be too low. The range of $5\star10^{13}/cm^2$ to $5\star10^{14}/cm^2$ has proven to be a suitable range for the integral doping.

In the exemplary embodiments so far, the externally triggered field effect transistor M1 was a MOSFET of the enhancement type, where the channel is formed through inversion of the substrate of n-emitter zone 4. However, the MOSFET M1 can also be a depletion type where the p-channel is present between zones 5a and 5b as a result of a p-doping, that is without the gate voltage already, and which can be made to disappear through a positive gate voltage. The other embodiments of the invention remain unchanged. Without voltage at the gate, this component is in the on-state condition; it is shut down through the positive voltage between G and K'.

A concrete succession of p- and n-zones was assumed for the exemplary embodiments, such as is generally preferred for practical operations. However, the exchange of the p- and n-mode of conductivity also results in functional components within the framework of the invention, which are desirable as inverse components for certain uses.

The inverse structure has the advantage that the MOSFET M1, which is connected in series with the thyristor, as well as the MOSFET M2 are now n-channel MOSFETs, which have a considerably lower channel resistance than p-channel MOSFETs. On the other hand, the switching characteristics of the thyristor are made worse by the fact that it is shut down from the anode side, which requires a thicker and more weakly doped base with comparably safe operating range.

I claim:

1. An MOS gate switchable power semiconductor component comprising a semiconductor body having a plurality of parallel-switched, side-by-side arranged unit cells that form a thyristor structure which consists of a p-emitter layer adjacent to an anode electrode attached to a lower surface of said body, a weakly doped n-base layer on said p-emitter layer, a p-base layer on said n-base layer, and an n-emitter layer composed of a highly doped n+-region bordered by a more weakly doped n-region, with said n-emitter layer and portions of said p-base layer adjacent to a top surface of said body;

a pair of spaced p+-regions formed inside said n-emitter layer at said top surface such that the pair of p+-regions serve as source and drain regions of a first p-channel lateral MOSFET, whereby said p+-source region is formed at portions of said highly doped n+-region, said more weakly doped n-region and at the interface of both said highly doped n+-region and said more weakly doped n-region, while said drain region is formed inside said more weakly doped n-region;

a first insulating gate electrode formed on the top surface of the body between said source and drain regions and separated form said source and drain regions by a first gate insulation layer, thereby completing said first MOSFET;

a first metal cathode electrode in electrical contact with only said drain region;

a second metal cathode electrode which simultaneously makes contact with said p+-source region (5a) of said first MOSFET and with said highly doped n+-region (4b) of said n-emitter layer;

wherein a second p-channel lateral MOSFET is formed from the p+-source region of the first MOSFET that makes contact with the first metal cathode electrode, the surface area of the p-base layer at said top surface, and a portion of the surface area of the weakly doped n-region at said top surface between the p+-source region and the surface area of the p-base layer:

and a second insulating gate electrode for the second MOSFET including a second gate insulation layer formed on said top surface of the body between the p+-source region and the surface area of the p base layer, and said first metal cathode electrode which extends over said second gats insulation layer; and, wherein the breakdown voltage of said first lateral p-channel MOSFET exceeds the absolute value of the threshold voltage of said second lateral p-channel MOSFET (M2) by more than two volts.

2. Power semiconductor component according to claim 1, wherein: a n-channel MOSFET is formed in a portion of the unit cells by a surface area of the n-base layer, the more weakly doped n-emitter region (4b), the surface area of the p-base layer between the n-base layer and the more weakly doped n-emitter region, and an insulating gate disposed on the top surface over the surface area of the p-base layer; the n-channel MOSFET is of the depletion type; the absolute value for the threshold voltage of the depletion-type n-channel MOSFET is lower by at least two volts than the breakdown voltage of the first p-channel MOSFET; and the gate electrode of the n-channel MOSFET is formed by the first metal cathode electrode or is covered by it.

3. Power semiconductor component according to claim 2, wherein the threshold voltages for the second MOSFET (M2) and the n-channel MOSFET (M3) are in the range of 1 V to 5 V.

4. Power semiconductor component according to claim 1 wherein the integral doping in the more weakly doped n-region of the n-emitter layer is in the range of $5\times10^{13}/cm^2$ to $5\times10^4/cm^2$.

5. Power semiconductor component according to claim 1, wherein the doping type for all of semiconductor layers and semicondutor regions is replaced by the complementary doping type.

6. Power semiconductor component according to claim 1, wherein the threshold voltage for the second MOSFET is in the range of 1 v to 5 V.

* * * * *